(12) United States Patent
Chen et al.

(10) Patent No.: US 11,713,239 B2
(45) Date of Patent: Aug. 1, 2023

(54) MEMS CHIP STRUCTURE

(71) Applicants: HUAWEI TECHNOLOGIES CO., LTD., Shenzhen (CN); Wuxi WiO Technologies Co., Ltd., Wuxi (CN)

(72) Inventors: Yiwen Chen, Dongguan (CN); Zhaoxing Huang, Wuxi (CN); Danyang Yao, Shenzhen (CN); Hong Tang, Wuxi (CN); Chendi Jiang, Wuhan (CN); Huikai Xie, Wuxi (CN)

(73) Assignees: Huawei Technologies Co., Ltd., Shenzhen (CN); Wuxi WiO Technologies Co., Ltd., Wuxi (CN)

( * ) Notice: Subject to any disclaimer, the term of this patent is extended or adjusted under 35 U.S.C. 154(b) by 384 days.

(21) Appl. No.: 16/915,601

(22) Filed: Jun. 29, 2020

(65) Prior Publication Data

US 2020/0325015 A1    Oct. 15, 2020

Related U.S. Application Data

(63) Continuation of application No. PCT/CN2018/122100, filed on Dec. 19, 2018.

(30) Foreign Application Priority Data

Dec. 29, 2017 (CN) .......................... 201711481331.1

(51) Int. Cl.
*B81B 3/00* (2006.01)
*B81B 7/00* (2006.01)
(Continued)

(52) U.S. Cl.
CPC .............. *B81B 7/02* (2013.01); *B81B 3/0081* (2013.01); *B81B 3/0083* (2013.01);
(Continued)

(58) Field of Classification Search
CPC .......................... B81B 3/0081; G02B 26/0833
See application file for complete search history.

(56) References Cited

U.S. PATENT DOCUMENTS

2004/0071393 A1* 4/2004 Staker .................... G02B 6/356
385/18
2004/0248417 A1* 12/2004 Malone ............... B81C 1/00833
438/692

(Continued)

FOREIGN PATENT DOCUMENTS

CN    102408091 A    4/2012
CN    104020561 A    9/2014
(Continued)

*Primary Examiner* — Moazzam Hossain
(74) *Attorney, Agent, or Firm* — Leydig, Voit & Mayer, Ltd.

(57) ABSTRACT

This application discloses a MEMS chip structure, including a substrate, a side wall, a dielectric plate, a MEMS micromirror array, and a grid array, where the MEMS micromirror array includes a plurality of grooves and a plurality of MEMS micromirrors. The plurality of MEMS micromirrors are in a one-to-one correspondence with the plurality of grooves. The grid array is located above the MEMS micromirror array, and a lower surface of the grid array is connected to upper surfaces of side walls of at least some of the plurality of grooves.

18 Claims, 4 Drawing Sheets

(51) Int. Cl.
*B81B 7/02* (2006.01)
*G02B 26/08* (2006.01)
(52) U.S. Cl.
CPC ... *B81B 2201/042* (2013.01); *B81B 2201/045* (2013.01); *B81B 2203/0323* (2013.01); *G02B 26/0866* (2013.01)

(56) References Cited

U.S. PATENT DOCUMENTS

| | | |
|---|---|---|
| 2005/0166677 A1 | 8/2005 | Nasiri et al. |
| 2006/0014312 A1* | 1/2006 | Malone ............... B81C 1/00833 438/48 |
| 2016/0025901 A1* | 1/2016 | Eguchi ............... G02B 26/0841 359/514 |
| 2017/0075074 A1 | 3/2017 | Zhang et al. |

FOREIGN PATENT DOCUMENTS

| | | |
|---|---|---|
| CN | 105223657 A | 1/2016 |
| CN | 106082107 A | 11/2016 |

\* cited by examiner

MEMS CHIP STRUCTURE

CROSS-REFERENCE TO RELATED APPLICATIONS

This application is a continuation of International Application No. PCT/CN2018/122100, filed on Dec. 19, 2018, which claims priority to Chinese Patent Application No. 201711481331.1, filed on Dec. 29, 2017. The disclosures of the aforementioned applications are hereby incorporated by reference in their entireties.

TECHNICAL FIELD

This application relates to the field of MEMS chips, and in particular, to an electro-thermal MEMS chip structure.

BACKGROUND

An electro-thermal micro-electro-mechanical system (MEMS) micromirror can be utilized in technological fields such as optical imaging, medical testing, micro display, and optical communication because of advantages such as a large scanning angle, a low drive voltage, low manufacturing costs, and simple control. Especially in the field of optical communication, an electro-thermal MEMS micromirror array chip with a large deflection angle is applicable to assembly of a large-scale optical cross-connect (OXC) module.

However, after being integrated into an array, electro-thermal MEMS micromirrors suffer from issues related to heat crosstalk. When one or more micromirrors adjacent to a working micromirror start to be powered on to work, the generated heat changes an ambient temperature distribution around the working micromirror, causing a drive arm of the working micromirror to heat up and resulting in a change in a deflection angle of the working micromirror. Severity of the heat crosstalk is also related to a raised height of a mirror surface of the micromirror, and the heat crosstalk is particularly severe when the mirror surface is raised out of a mirror frame. This results in extremely complicated control over the micromirror and degraded performance.

SUMMARY

An objective of this application is to provide a MEMS chip structure, so as to resolve a problem of heat crosstalk for an electro-thermal MEMS micromirror.

According to a first aspect, a MEMS chip structure is provided, including a substrate, a side wall, a dielectric plate, a MEMS micromirror array, and a grid array, where the side wall is of an annular structure, the substrate covers an opening on one side of the side wall, the dielectric plate covers an opening on the other side of the side wall, and the side wall, the substrate, and the dielectric plate form a hollow structure; the MEMS micromirror array and the grid array are located inside the hollow structure; the MEMS micromirror array is located above the substrate, and the MEMS micromirror array includes a plurality of grooves and a plurality of MEMS micromirrors, where the plurality of MEMS micromirrors are in a one-to-one correspondence with the plurality of grooves, and the plurality of MEMS micromirrors are located in the corresponding plurality of grooves or above the corresponding plurality of grooves; and the grid array is located above the MEMS micromirror array, and a lower surface of the grid array is connected to an upper surfaces of side walls of at least some of the plurality of grooves.

In the MEMS chip structure provided in this embodiment of this application, the grid array is introduced to restrain heat of adjacent MEMS micromirrors in the MEMS micromirror array from passing via convection and/or conduction through gas above the MEMS micromirror array, thereby ensuring that control of each MEMS micromirror is relatively independent and reducing an impact of the heat crosstalk.

In a possible implementation, an upper surface of the grid array is connected to the dielectric plate. The grid array, the plurality of grooves, and the dielectric plate form a plurality of hollow structures to separate MEMS chips from each other, thereby further reducing the impact of the heat crosstalk.

In a possible implementation, a height of the grid array is not less than $1/10$ of a distance from an upper surface of a side wall of any of the plurality of grooves to the dielectric plate.

In a possible implementation, a distance from an upper surface of the grid array to the substrate is not less than a farthest distance from any of the plurality of MEMS micromirrors to the substrate. In this embodiment of this application, while an effect of reducing the heat crosstalk is achieved, space required for rotation of the MEMS micromirror can be further ensured without affecting a rotation angle of the MEMS micromirror.

In a possible implementation, the grid array includes a plurality of grid units, and each grid unit is of an annular structure, where the plurality of grid units are in a one-to-one correspondence with the plurality of grooves, and a width of a frame of the grid unit is not greater than a width of a side wall of the corresponding groove. In this embodiment of this application, there is no obstruction above the MEMS micromirror, and an optical path switching function of the MEMS micromirror is not affected.

In a possible implementation, a line connecting a geometric center of the grid unit and a geometric center of the corresponding groove is perpendicular to a bottom surface of the corresponding groove.

In a possible implementation, the dielectric plate has a light transmission characteristic. The dielectric plate may be further coated with an antireflective film to improve a light transmission property and to reduce a loss of an optical signal while protecting the MEMS micromirror from external dust, where the loss of the optical signal is generated when the optical signal passes through the dielectric plate. In a possible implementation, the MEMS chip structure further includes a solder ball layer, and the solder ball layer is located inside the hollow structure and between the substrate and the MEMS micromirror array.

In a possible implementation, the MEMS chip structure further includes a thin film layer, the thin film layer is located inside the hollow structure and between the lower surface of the grid array and upper surfaces of side walls of the plurality of grooves, and a heat conductivity of the thin film layer is greater than a heat conductivity of the grid array. In this embodiment of this application, a larger portion of heat can be conducted by a frame of a grid unit and the thin film layer down to a side wall of a corresponding groove and then to the substrate, thereby further reducing the impact of the heat crosstalk.

In a possible implementation, a material of the grid array includes any one of silicon, glass, resin, or metal; and the grid array is produced by using a semiconductor etching process.

According to a second aspect, a MEMS chip structure is provided, including a substrate, a MEMS micromirror array, a grid array, and a dielectric plate, where the MEMS micromirror array is located above the substrate, and the MEMS micromirror array includes a plurality of grooves and a plurality of MEMS micromirrors, where the plurality of MEMS micromirrors are in a one-to-one correspondence with the plurality of grooves, and the plurality of MEMS micromirrors are located in the corresponding plurality of grooves or above the corresponding plurality of grooves; the grid array is located above the MEMS micromirror array, and a lower surface of the grid array is connected to upper surfaces of side walls of at least some of the plurality of grooves; and the dielectric plate is located above the grid array and is connected to an upper surface of the grid array.

In the MEMS chip structure provided in this embodiment of this application, the grid array is introduced to suppress heat crosstalk between adjacent MEMS micromirrors in the MEMS micromirror array, thereby ensuring that control of each MEMS micromirror is relatively independent and reducing an impact of the heat crosstalk. In addition, compared with the MEMS chip structure according to the first aspect, the MEMS chip structure provided in this embodiment of this application has an advantage of a smaller size.

In a possible implementation, the dielectric plate has a light transmission characteristic.

In a possible implementation, the grid array includes a plurality of grid units, and each grid unit has an annular structure, wherein the plurality of grid units are in a one-to-one correspondence with the plurality of grooves, and a width of a frame of the grid unit is not greater than a width of a side wall of the corresponding groove.

In a possible implementation, the MEMS chip structure further includes a solder ball layer, and the solder ball layer is located between the substrate and the MEMS micromirror array.

In a possible implementation, the MEMS chip structure further includes a thin film layer, the thin film layer is located between the lower surface of the grid array and upper surfaces of side walls of the plurality of grooves, and a heat conductivity of the thin film layer is greater than a heat conductivity of the grid array.

In a possible implementation, a material of the grid array includes any one of silicon, glass, resin, or metal; and the grid array is produced by using a semiconductor etching process.

Beneficial effects of the foregoing possible implementations are all described in detail in the possible implementations of the MEMS chip structure according to the first aspect, and details are not described herein.

According to a third aspect, an optical switch is provided, including an input port array, an input port micromirror array, an output port micromirror array, and an output port array, where the input port array is configured to receive an optical signal; the input port micromirror array is configured to reflect, to the output port micromirror array, the optical signal output by the input port array; the output port micromirror array is configured to reflect, to the output port array, the optical signal reflected by the input port micromirror array; and the output port array is configured to send the received optical signal; where the input port micromirror array and the output port micromirror array each include the MEMS chip structure, and MEMS micromirrors included in the input port micromirror array and the output port micromirror array are deflected to switch, to different output ports of the output port array, an optical signal that is input from an input port in the input port array, to implement optical path switching.

In the MEMS chip structure provided in this embodiment of this application, a grid array is introduced to suppress heat crosstalk between adjacent MEMS micromirrors in a MEMS micromirror array, thereby ensuring that control of each MEMS micromirror is relatively independent and reducing an impact of heat crosstalk.

DESCRIPTION OF EMBODIMENTS

The following describes the technical solutions in the embodiments of this application with reference to the accompanying drawings in this application.

Figure 1:
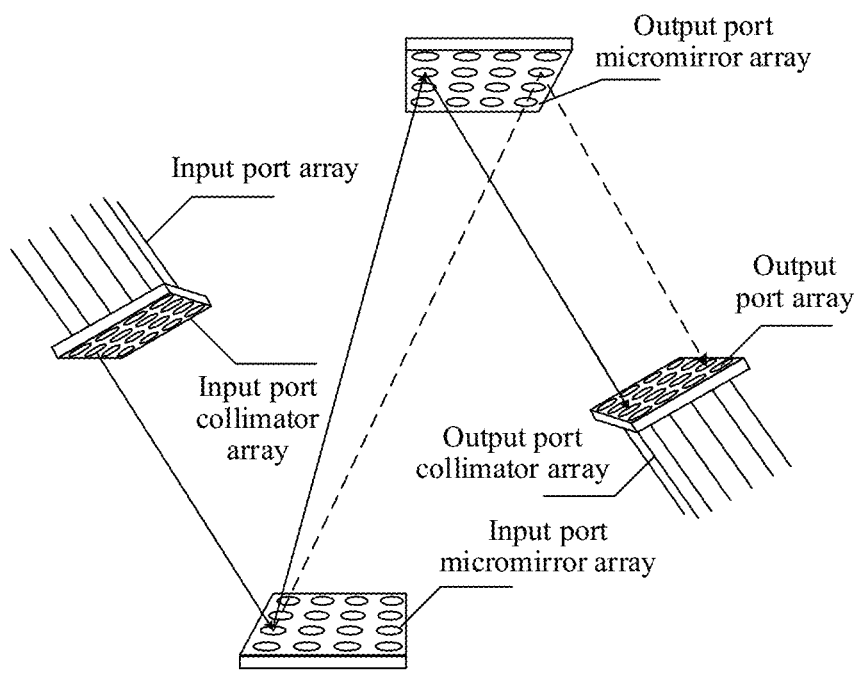
FIG. 1 is a schematic block diagram of a MEMS optical switch.

This application relates to a MEMS chip structure, which can be a core component of an optical switch in the field of optical switching. FIG. 1 is a schematic block diagram of a MEMS optical switch. The MEMS optical switch includes an input port array, an input port micromirror array, an output port micromirror array, and an output port array. The input port array is configured to receive an optical signal; the input port micromirror array reflects the received optical signal to the output port micromirror array; and the output port micromirror array reflects, to the output port array, the optical signal reflected by the input port micromirror array, so as to send the optical signal. Micromirrors included in the input port micromirror array or the output port micromirror array can be deflected in two directions perpendicular to each other, and may switch, to different output ports, an optical signal that is input from an input port, thereby implementing a switching function of the optical switch. In addition, the MEMS optical switch generally further includes an input port collimator array and an output port collimator array. The input port collimator array and the output port collimator array are configured to collimate and expand a received optical signal.

Figure 2:
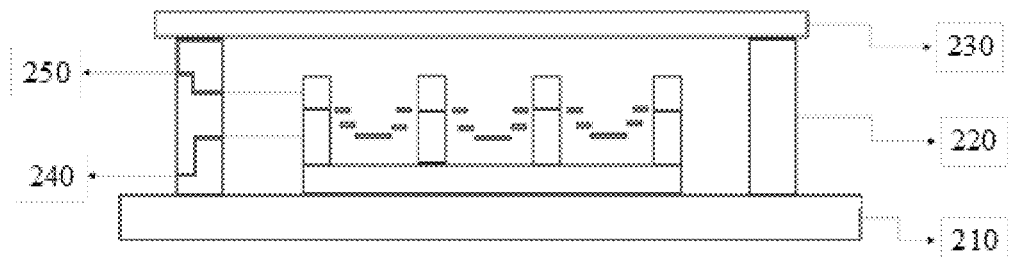
FIG. 2 is a side view of a MEMS chip structure according to an embodiment of this application.
Figure 3:
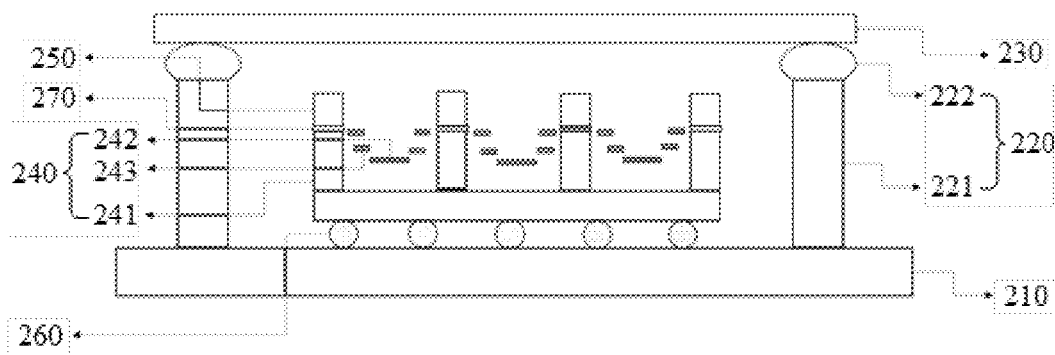
FIG. 3 is a side view of another MEMS chip structure according to an embodiment of this application.

Specifically, an electro-thermal MEMS micromirror chip is applicable to assembly of a large-scale optical switch structure because of a large scanning angle and a low drive voltage. The MEMS chip structure disclosed in this application is an electro-thermal MEMS chip structure, and may be used as the input port micromirror array or the output port micromirror array of the MEMS optical switch shown in FIG. 1, such as to be applied to the field of optical switching. FIG. 2 is a side view of a MEMS chip structure according to an embodiment of this application. The MEMS chip structure includes a substrate 210, a side wall 220, a dielectric plate 230, a MEMS micromirror array 240, and a grid array 250. The side wall 220 has an annular structure. The substrate 210 covers an opening on one side of the side wall 220, the dielectric plate 230 covers an opening on the other side of the side wall 220, and the side wall 220, the substrate 210, and the dielectric plate 230 form a hollow structure. Specifically, the side wall 220 may have any annular structure such as a square ring or a circular ring. As shown in FIG. 3, the side wall 220 includes a support ring 221 and a sealing ring 222. The support ring 221 is located on the substrate 210, and the sealing ring 222 is located between the support ring 221 and the dielectric plate 230 to bond the support ring 221 to the dielectric plate 230, e.g., forming an airtight bond between the support ring 221 and the dielectric plate 230.

Optionally, the substrate 210 may be made of a printed circuit board (PCB), ceramic, or the like. The dielectric plate 230 has a light transmission characteristic, and may be made of a material such as quartz or sapphire. Further, the dielectric plate 230 may be coated with an antireflection film, to improve a light transmission property of the dielectric plate 230. The sealing ring 222 may use solder to bond the support ring 221 to the dielectric plate 230 through welding. The support ring 221 may be made of a material such as Kovar alloy, copper, or steel.

The MEMS micromirror array 240 and the grid array 250 are both located inside the hollow structure. The MEMS micromirror array 240 is located above the substrate 210, and the MEMS micromirror array 240 includes a plurality of grooves 241 and a plurality of MEMS micromirrors 242, where the plurality of MEMS micromirrors 242 are in a one-to-one correspondence with the plurality of grooves 241, and the plurality of MEMS micromirrors 242 are located in the corresponding plurality of grooves 241 or above the corresponding plurality of grooves 241. The grid array 250 is located above the MEMS micromirror array 240, and a lower surface of the grid array 250 is connected to upper surfaces of the side walls of at least some of the plurality of grooves 241.

Specifically, when the lower surface of the grid array 250 is connected to upper surfaces of the side walls of all of the plurality of grooves 241, a heat insulation effect is better.

Further, the MEMS micromirror array 240 includes drive arms 243. The drive arms 243 connect each MEMS micromirror 242 to a side wall of the corresponding groove 241, and each drive arm 243 can move or deform. A voltage or a current that is loaded on the drive arm 243 is changed, so that the drive arm 243 moves or deforms and drives the MEMS micromirror 242 to rotate. Optionally, the MEMS chip structure further includes a solder ball layer 260. The solder ball layer 260 is located inside the hollow structure and between the substrate 210 and the MEMS micromirror array 240, where the solder ball layer 260 is connected to electrodes to supply power to the drive arms 243 of the MEMS micromirror array 240.

However, after being integrated into an array, electrically driven MEMS micromirrors can suffer from adverse effects of heat crosstalk. When one or more MEMS chip units (a MEMS micromirror, a groove and drive arms in the MEMS micromirror array together constitute a MEMS chip unit, where the groove and the drive arms are corresponding to the MEMS micromirror) adjacent to a MEMS micromirror unit (which is denoted as a MEMS chip unit 1) in a working state start to be powered on to work, generated heat changes ambient temperature distribution around the MEMS chip unit 1, causing a drive arm of the MEMS chip unit 1 to heat up and resulting in a change in a deflection angle of a MEMS micromirror of the MEMS chip unit 1. In the MEMS chip structure provided in this embodiment of this application, the grid array is introduced to restrain heat of adjacent MEMS chip units from transferring to adjacent MEMS chip units by convection and/or conduction through a gas above the MEMS micromirror array, thereby ensuring that control of each MEMS chip unit is relatively independent and reducing an impact of the heat crosstalk.

Figure 4A:
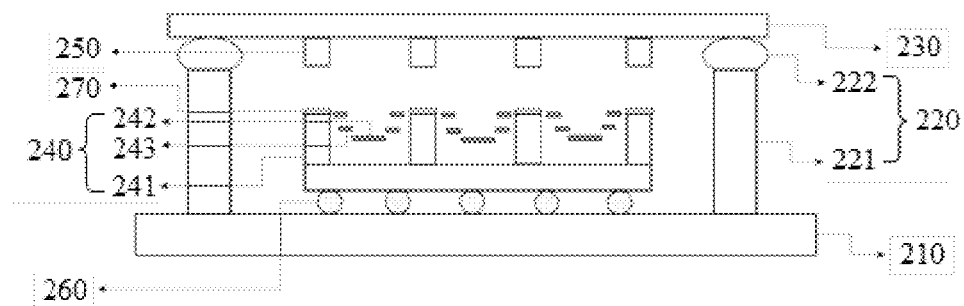
FIG. 4(a) is a side view of still another MEMS chip structure according to an embodiment of this application.
Figure 4B:
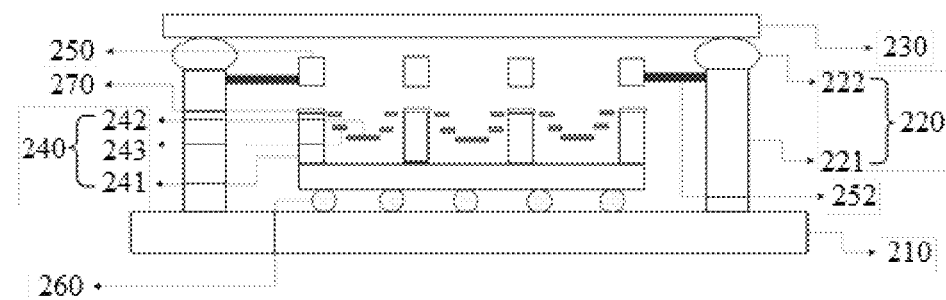
FIG. 4(b) is a side view of yet another MEMS chip structure according to an embodiment of this application.

Optionally, a height of the grid array 250 is not less than $1/10$ of a distance from the upper surfaces of the side walls of the plurality of grooves 241 to the dielectric plate 230. Further, an upper surface of the grid array 250 is connected to the dielectric plate 230. MEMS chip units are separated into closed units independent of each other by using the grid array 250 and the dielectric plate 230, to minimize the impact of the heat crosstalk. In addition, in some special cases, for example, in a case in which frames of the grooves of the MEMS micromirror array 240 are not allowed to be connected to the grid array 250, the grid array 250 may alternatively be connected to the dielectric plate 230 without contacting the MEMS micromirror array 240, as shown in FIG. 4(a). In this way, heat is introduced by the grid array 250 to the dielectric plate 230, so that the heat crosstalk is reduced. Alternatively, the grid array 250 may be connected by a support structure 252 to the side wall 220 without contacting the MEMS micromirror array 240, as shown in FIG. 4(b). In this way, heat is introduced by the grid array 250 and the support structure 252 to the side wall 220, so that the heat crosstalk can also be suppressed to some extent. It should be noted that, any one or more of the following three characteristics may be met: (1) The upper surface of the grid array is connected to the dielectric plate; (2) the grid array is connected to the side wall through the support structure; and (3) the lower surface of the grid array is connected to upper surfaces of the side wall of the grooves. This is not limited in this embodiment of this application.

Optionally, a distance from an upper surface of the grid array 250 to the substrate 210 is not less than a farthest distance from any of the plurality of MEMS micromirrors 242 to the substrate 210. In a working state, the MEMS micromirror 242 is driven by the drive arm 243 to rotate by different angles. Therefore, a distance from the MEMS micromirror 242 to the substrate 210 is variable. A farthest distance from the MEMS micromirror 242 to the substrate 210 is a distance from the substrate 210 to a highest position (namely, a position closest to the dielectric plate 230) to which the MEMS micromirror 242 can be moved. A position of the upper surface of the grid array is not lower than the highest position to which the MEMS micromirror 242 can be moved, so that the impact of the heat crosstalk can be suppressed more effectively.

Figure 5:
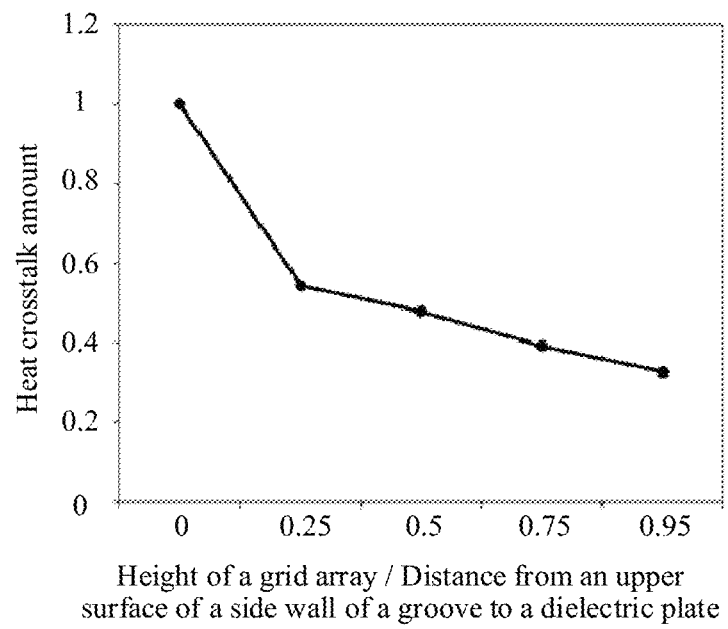
FIG. 5 is a simulation diagram of effects of heat crosstalk without a grid array and by adding grid arrays with different heights.

FIG. 5 shows effects of heat crosstalk without a grid array and by adding grid arrays with different heights (an ordinate indicates a normalized value of a heat crosstalk amount). The grid array herein is made of a silicon material. Optionally, a material of the grid array may be any one of silicon, glass, resin, or metal. Heat conductivities of the silicon, glass, resin, or metal each are higher than a heat conductivity of gas (for example, air, krypton, or argon) filled in the hollow structure. It can be seen from FIG. 5 that, with introduction of the grid array, the effect of suppressing the heat crosstalk is clearly enhanced. As the height of the grid array increases, the effect of suppressing the heat crosstalk is gradually enhanced. When a ratio of the height of the grid array to a distance from the upper surfaces of the side walls of the grooves to the dielectric plate is close to 1, heat crosstalk is only approximately ⅓ of heat crosstalk generated when the grid array is not added.

Optionally, the MEMS chip structure further includes a thin film layer 270. The thin film layer 270 is located inside the hollow structure and between the lower surface of the grid array and the upper surfaces of the side walls of the plurality of grooves 241, as shown in FIG. 3. A heat conductivity of the thin film layer 270 is greater than a heat conductivity of the grid array 250. The thin film layer 270 may be made of a material with a high heat conductivity, such as graphite or graphene. One MEMS chip unit in a working state is used as an example. After the MEMS chip unit is powered on, heat dissipated by drive arms 243 may be transferred by the grid array 250 and the thin film layer 270 to a side wall of a groove 241 of the MEMS micromirror array 240 and then to the substrate 210, so that heat transferred to an adjacent MEMS chip unit by gas filled in the hollow structure is decreased, and the impact of the heat crosstalk is further reduced.

Figure 6A:
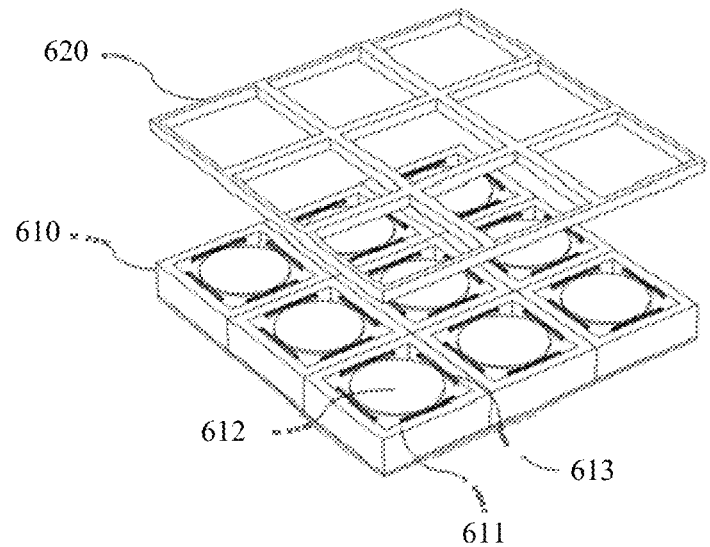
FIG. 6(a) is a diagram of three-dimensional structures of a MEMS micromirror array and a grid array.
Figure 6B:
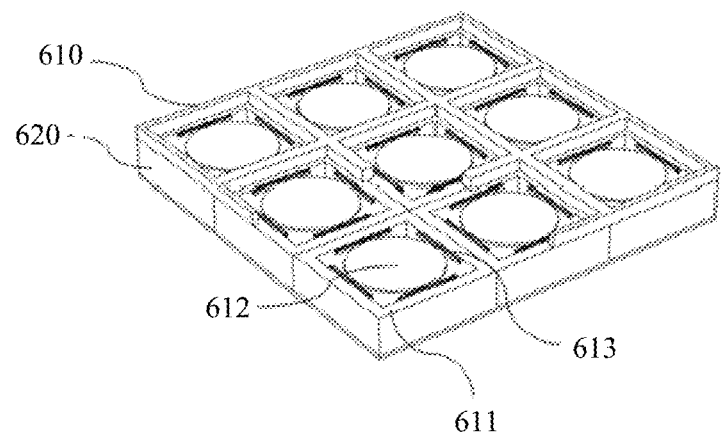
FIG. 6(b) is a diagram of a three-dimensional structure obtained after a MEMS micromirror array and a grid array are connected.

FIG. 6(a) shows three-dimensional structures of a MEMS micromirror array 610 and a grid array 620. FIG. 6(b) shows a connection relationship between the MEMS micromirror array 610 and the grid array 620 that are in a MEMS chip structure according to an embodiment of this application. It should be noted that, for ease of understanding the connection relationship between the MEMS micromirror array 610 and the grid array 620, the grid array 620 in FIG. 6(b) has a missing part in a lower left corner. An actual structure of the grid array 620 may have no missing part. In FIG. 6(a) and FIG. 6(b), the MEMS micromirror array 610 includes nine grooves 611, nine MEMS micromirrors 612, and nine groups of drive arms 613. Each MEMS micromirror 612 is corresponding to one groove 611 and one group of drive arms 613. Each MEMS micromirror 612 is located in the corresponding groove 611 or above the corresponding groove 611, and is connected by the corresponding drive arms 613 to a side wall of the groove 611. The grid array 620 in the figure also includes nine grid units 621. Each annular frame is one grid unit 621. It may be understood that, the grid unit may alternatively be in a structure such as a circular ring or a hexagon ring, provided that the grid unit is corresponding to the groove. This is not limited in this embodiment of this application. It can be learned from FIG. 6(b) that, the grid units 621 are in a one-to-one correspondence with the grooves 611, and a frame of each grid unit 621 is connected to an upper surface of a side wall of the corresponding groove 611, so that isolation between two adjacent MEMS micromirrors 612 is higher, and heat transfer is more difficult.

Optionally, a width of the frame of the grid unit 621 is not greater than a width of the side wall of the groove 611, so that the MEMS micromirror 612 is not blocked, and an optical path switching function of the MEMS micromirror 612 is not affected. Optionally, a line connecting a geometric center of the grid unit 621 and a geometric center of the corresponding groove 611 is perpendicular to a bottom surface of the corresponding groove 611.

The grid array disclosed in this embodiment of this application may be produced by using a semiconductor etching process, such as photoetching, development, or corrosion. Due to a limitation of the etching process, a thickness of the grid array cannot be too large. When a distance from the MEMS micromirror array to a dielectric plate is relatively long, a requirement for the thickness of the grid array may be satisfied by superimposing a plurality of grid arrays, so as to implement effective suppression of heat crosstalk. In addition, the grid array may be separately produced, and then the produced grid array is packaged above the MEMS micromirror array. A packaging process is simple and easy.

Figure 7:
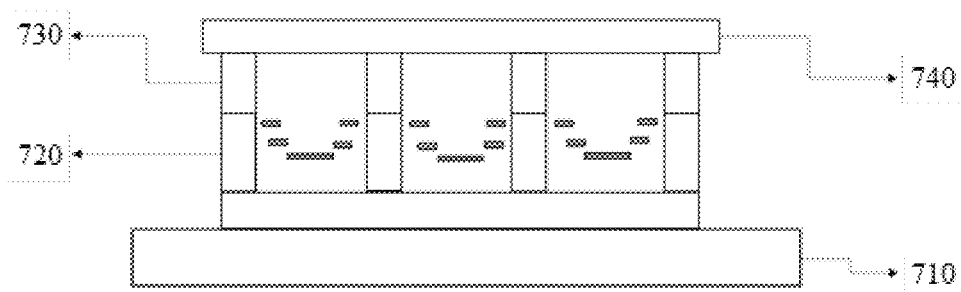
FIG. 7 is a side view of still yet another MEMS chip structure according to an embodiment of this application.

FIG. 7 is a side view of still yet another MEMS chip structure according to an embodiment of this application. The MEMS chip structure includes a substrate 710, a MEMS micromirror array 720, a grid array 730, and a dielectric plate 740. The MEMS micromirror array 720 is located above the substrate 710, and includes a plurality of grooves 721 and a plurality of MEMS micromirrors 722, where the plurality of MEMS micromirrors 722 are in a one-to-one correspondence with the plurality of grooves 721, and the plurality of MEMS micromirrors 242 are located in the corresponding grooves 721 or above the corresponding grooves 721. The grid array 730 is located above the MEMS micromirror array 720, and a lower surface of the grid array 730 is connected to upper surfaces of side walls of at least some of the plurality of grooves 721. The dielectric plate 740 is located above the grid array 730, and is connected to an upper surface of the grid array 730.

Optionally, the substrate 710 may be made of a material such as a PCB or ceramic. The dielectric plate 740 has a light transmission characteristic, and may be made of a material such as quartz or sapphire. Further, the dielectric plate 740 may be coated with an antireflection film, to improve a light transmission property of the dielectric plate 740. A material of the grid array may be any one of silicon, glass, resin, or metal. Heat conductivities of the silicon, glass, resin, or metal each are higher than a heat conductivity of gas (for example, air, krypton, or argon) filled in a hollow structure formed by the dielectric plate 740, the grid array 730, and the grooves 721.

Figure 8:
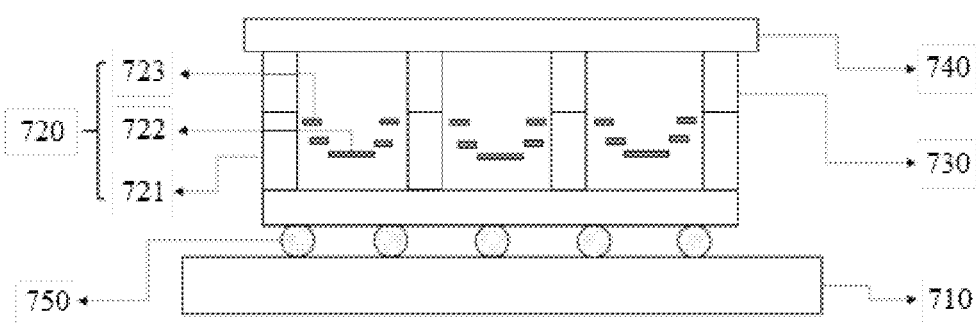
FIG. 8 is a side view of a further MEMS chip structure according to an embodiment of this application.

Further, the MEMS micromirror array 720 includes drive arms 723. The drive arms 723 connect the MEMS micromirror 722 to a side wall of the corresponding groove 721, and the drive arm 723 can move or deform. A voltage or a current that is loaded on the drive arm 723 is changed, so that the drive arm 723 moves or deforms and drives the MEMS micromirror 722 to rotate. Optionally, the MEMS chip structure further includes a solder ball layer 750. The solder ball layer 750 is located between the substrate 710 and the MEMS micromirror array 720, and the solder ball layer 750 is connected to n electrodes to supply power to the drive arms 723 of the MEMS micromirror array 720. A structure of the solder ball layer 750 is shown in FIG. 8.

Similarly, after being integrated into an array, electrically driven MEMS micromirrors can suffer due to issues related to heat crosstalk. A reason for having the problem of the heat crosstalk is described in detail in the foregoing embodiment, and details are not described in this embodiment. In the MEMS chip structure provided in this embodiment of this application, the grid array with a high heat conductivity is introduced to suppress heat crosstalk between adjacent MEMS chip units (a MEMS micromirror, a groove, and drive arms in the MEMS micromirror array together constitute a MEMS chip unit, where the groove and the drive arms are corresponding to the MEMS micromirror), thereby ensuring that control of each MEMS chip unit is relatively independent and reducing an impact of the heat crosstalk. In addition, due to a limitation of an etching process, it is difficult to etch side walls of the grooves in the MEMS micromirror array fairly deep. The grid array is connected to upper surfaces of side walls of the grooves, so that space of the hollow structure formed by the grooves, the grid array, and the dielectric plate can be large enough, thereby ensuring that rotation of the MEMS micromirrors is not affected.

Optionally, the MEMS chip structure further includes a thin film layer, the thin film layer is located between the lower surface of the grid array 730 and upper surfaces of side walls of the plurality of grooves 721, and a heat conductivity of the thin film layer is greater than a heat conductivity of the grid array 730. The thin film layer may be made of a material with a high heat conductivity, such as graphite or graphene. The thin film layer with a high heat conductivity is introduced, so that a larger portion of heat dissipated by the drive arms 723 can be transferred by the grid array 730 and the thin film layer to the side walls of the grooves 721 of the MEMS micromirror array 720 and then to the substrate 710, and the impact of the heat crosstalk is further reduced.

Optionally, the grid array 730 includes a plurality of grid units 731, and the grid unit 731 has an annular structure and may be a square ring, a circular ring, or the like. The plurality of grid units 731 are in a one-to-one correspondence with the plurality of grooves 721, and a width of a frame of the grid unit 731 is not greater than a width of the side wall of the groove 721, so that the MEMS micromirror is not blocked, and an optical path switching function of the MEMS micromirror is not affected. Optionally, a line connecting a geometric center of the grid unit 731 and a geometric center of the corresponding groove 721 is perpendicular to a bottom surface of the corresponding groove 721.

The grid array disclosed in this embodiment of this application may be produced by using a semiconductor etching process such as photoetching, development, or corrosion. Due to a limitation of the etching process, a thickness of the grid array cannot be too large. When a distance from the MEMS micromirror array to the dielectric plate is relatively long, a requirement for the thickness of the grid array may be satisfied by superimposing a plurality of grid arrays, so as to implement suppression of heat crosstalk. In addition, the grid array may be separately produced, and then the produced grid array is packaged above the MEMS micromirror array. A packaging process is simple and easy.

It should be noted that, although this application is described with reference to specific features and the embodiments thereof, it is clearly that various modifications and combinations may be made to them without departing from the scope of this application. Correspondingly, the specification and accompanying drawings are merely example descriptions of the present disclosure, and are intended to cover any of or all modifications, variations, combinations or equivalents that fall within the scope of the present disclosure. It is clearly that a person skilled in the art can make various modifications and variations to this application without departing from the spirit of this application. This application covers these modifications and variations of this application provided that they fall within the scope of the claims of this application and their equivalent technologies.

What is claimed is:

1. A MEMS chip structure, comprising,
   a substrate,
   a side wall having an annular structure,
   a dielectric plate,
   a MEMS micromirror array comprising a plurality of grooves and a plurality of MEMS micromirrors and located above the substrate, wherein the plurality of MEMS micromirrors are in a one-to-one correspondence with the plurality of grooves, and the plurality of MEMS micromirrors are located in the corresponding plurality of grooves or above the corresponding plurality of grooves, and
   a grid array located above the MEMS micromirror array, and a lower surface of the grid array is connected to upper surfaces of side walls of at least some of the plurality of grooves,
   wherein:
      the substrate covers an opening on one side of the side wall, the dielectric plate covers an opening on the other side of the side wall, and the side wall, the substrate, and the dielectric plate form a hollow structure; and
      the MEMS micromirror array and the grid array are located inside the hollow structure.

2. The MEMS chip structure according to claim 1, wherein an upper surface of the grid array is connected to the dielectric plate.

3. The MEMS chip structure according to claim 1, wherein a height of the grid array is not less than $1/10$ of a distance from an upper surface of a side wall of any of the plurality of grooves to the dielectric plate.

4. The MEMS chip structure according to claim 1, wherein a distance from an upper surface of the grid array to the substrate is not less than a farthest distance from any of the plurality of MEMS micromirrors to the substrate.

5. The MEMS chip structure according to claim 1, wherein the grid array comprises a plurality of grid units, and each grid unit is of an annular structure, wherein the plurality of grid units are in a one-to-one correspondence with the plurality of grooves, and a width of a frame of each grid unit is not greater than a width of a side wall of a corresponding groove.

6. The MEMS chip structure according to claim 5, wherein a line connecting a geometric center of each grid unit and a geometric center of the corresponding groove is perpendicular to a bottom surface of the corresponding groove.

7. The MEMS chip structure according to claim 1, wherein the dielectric plate has a light transmission characteristic.

8. The MEMS chip structure according to claim 1, wherein the MEMS chip structure further comprises a solder ball layer, and the solder ball layer is located inside the hollow structure and between the substrate and the MEMS micromirror array.

9. The MEMS chip structure according to claim 1, wherein the MEMS chip structure further comprises a thin film layer located inside the hollow structure and between the lower surface of the grid array and upper surfaces of side walls of the plurality of grooves, and wherein a heat conductivity of the thin film layer is greater than a heat conductivity of the grid array.

10. The MEMS chip structure according to claim 1, wherein a material of the grid array comprises any one of silicon, glass, resin, or metal, and wherein the grid array is produced by using a semiconductor etching process.

11. An optical switch, comprising:
   an input port array configured to receive an optical signal,
   an input port micromirror array including the MEMS chip structure according to claim 1,
   an output port micromirror array including the MEMS chip structure according to claim 1, and
   an output port array,
   wherein:

the input port micromirror array is configured to reflect, to the output port micromirror array, the optical signal output by the input port array;

the output port micromirror array is configured to reflect, to the output port array, the optical signal reflected by the input port micromirror array;

the output port array is configured to transmit the received optical signal; and MEMS micromirrors included in the input port micromirror array and the output port micromirror array are deflected to switch, to different output ports of the output port array, the optical signal to implement optical path switching.

12. A MEMS chip structure, comprising:

a substrate, a MEMS micromirror array comprising a plurality of grooves and a plurality of MEMS micromirrors and located above the substrate, wherein the plurality of MEMS micromirrors are in a one-to-one correspondence with the plurality of grooves, and the plurality of MEMS micromirrors are located in the corresponding plurality of grooves or above the corresponding plurality of grooves, a grid array located above the MEMS micromirror array, wherein a lower surface of the grid array is connected to upper surfaces of side walls of at least some of the plurality of grooves, and a dielectric plate located above the grid array and is connected to an upper surface of the grid array.

13. The MEMS chip structure according to claim 12, wherein the dielectric plate has a light transmission characteristic.

14. The MEMS chip structure according to claim 12, wherein the grid array comprises a plurality of grid units, and each grid unit has an annular structure, wherein the plurality of grid units are in a one-to-one correspondence with the plurality of grooves, and a width of a frame of each grid unit is not greater than a width of a side wall of the corresponding groove.

15. The MEMS chip structure according to claim 12, wherein the MEMS chip structure further comprises a solder ball layer, and the solder ball layer is located between the substrate and the MEMS micromirror array.

16. The MEMS chip structure according to claim 12, wherein the MEMS chip structure further comprises a thin film layer located between the lower surface of the grid array and upper surfaces of side walls of the plurality of grooves, and wherein a heat conductivity of the thin film layer is greater than a heat conductivity of the grid array.

17. The MEMS chip structure according to claim 12, wherein a material of the grid array comprises any one of silicon, glass, resin, or metal, and wherein the grid array is produced by using a semiconductor etching process.

18. An optical switch, comprising:

an input port array configured to receive an optical signal, an input port micromirror array including the MEMS chip structure according to claim 12, an output port micromirror array including the MEMS chip structure according to claim 12, and an output port array, wherein:

the input port micromirror array is configured to reflect, to the output port micromirror array, the optical signal output by the input port array;

the output port micromirror array is configured to reflect, to the output port array, the optical signal reflected by the input port micromirror array;

the output port array is configured to transmit the received optical signal; and MEMS micromirrors included in the input port micromirror array and the output port micromirror array are deflected to switch, to different output ports of the output port array, the optical signal to implement optical path switching.

\* \* \* \* \*

UNITED STATES PATENT AND TRADEMARK OFFICE
CERTIFICATE OF CORRECTION

PATENT NO. : 11,713,239 B2  
APPLICATION NO. : 16/915601  
DATED : August 1, 2023  
INVENTOR(S) : Chen et al.

Page 1 of 1

It is certified that error appears in the above-identified patent and that said Letters Patent is hereby corrected as shown below:

In the Claims

Claim 1: Column 9, Line 60: "A MEMS chip structure, comprising," should read -- A MEMS chip structure, comprising: --.

Signed and Sealed this  
Twelfth Day of December, 2023

Katherine Kelly Vidal  
*Director of the United States Patent and Trademark Office*